United States Patent
France et al.

(10) Patent No.: US 11,205,993 B2
(45) Date of Patent: Dec. 21, 2021

(54) VERSATILE FLEXIBLE CIRCUIT INTERCONNECTION FOR CONNECTING TWO FLEXIBLE SOLAR CELLS

(71) Applicant: Utica Leaseco, LLC, Rochester Hills, MI (US)

(72) Inventors: Christopher Earl France, Campbell, CA (US); Linlin Yang, Sunnyvale, CA (US); Liguang Lan, Sunnyvale, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 0 days.

(21) Appl. No.: 16/570,882

(22) Filed: Sep. 13, 2019

(65) Prior Publication Data
US 2020/0028466 A1 Jan. 23, 2020

Related U.S. Application Data

(62) Division of application No. 15/372,085, filed on Dec. 7, 2016, now Pat. No. 10,418,933.

(Continued)

(51) Int. Cl.
*H01L 31/042* (2014.01)
*H02N 6/00* (2006.01)
(Continued)

(52) U.S. Cl.
CPC ........ *H02S 40/36* (2014.12); *H01L 31/02013* (2013.01); *H01L 31/022425* (2013.01);
(Continued)

(58) Field of Classification Search
CPC ............... H02S 40/36; H01L 31/02013; H01L 31/0508; Y02E 10/50
See application file for complete search history.

(56) References Cited

U.S. PATENT DOCUMENTS

| 5,616,185 A | 4/1997 | Kukulka |
| 6,359,209 B1 | 3/2002 | Glenn et al. |

(Continued)

FOREIGN PATENT DOCUMENTS

| CN | 102270683 A | 12/2011 |
| JP | 2008039716 A | 2/2008 |

(Continued)

OTHER PUBLICATIONS

Partial International Search Report dated Mar. 9, 2017 issued in International Patent Application No. PCT/US2016/065612.

(Continued)

*Primary Examiner* — Angelo Trivisonno
(74) *Attorney, Agent, or Firm* — Arent Fox LLP

(57) ABSTRACT

A flexible circuit that allows a standardized connection interface to connect flexible solar cell(s) for easy integration into electronics devices. This interconnection scheme does not limit the intrinsic solar cell flexibility and may conform to standard design practices in electronic device manufacturing. In an aspect, a solar module is described that includes one or more solar panels and a flexible trace or interconnect having conductive wires inside an insulation material. In another aspect, an electronic device is described that includes a circuit board, one or more solar panels and a flexible trace or interconnect having conductive wires inside an insulation material. The electronic device may be an internet-of-things (IoT) device or an unmanned aerial vehicle (UAV), for example. In yet another aspect, a lighting module is described that includes one or more lighting panels and a flexible trace or interconnect having conductive wires inside an insulation material.

20 Claims, 5 Drawing Sheets

Related U.S. Application Data

(60) Provisional application No. 62/264,751, filed on Dec. 8, 2015.

(51) Int. Cl.
| | | |
|---|---|---|
| H02S 40/36 | (2014.01) | |
| H01L 31/02 | (2006.01) | |
| H01L 31/05 | (2014.01) | |
| H01L 51/00 | (2006.01) | |
| H01L 51/44 | (2006.01) | |
| H01L 31/046 | (2014.01) | |
| H02S 40/32 | (2014.01) | |
| H02S 40/38 | (2014.01) | |
| H01L 31/0224 | (2006.01) | |
| H01L 31/0304 | (2006.01) | |
| H01L 31/0392 | (2006.01) | |
| H01L 31/18 | (2006.01) | |

(52) U.S. Cl.
CPC .. *H01L 31/022466* (2013.01); *H01L 31/0304* (2013.01); *H01L 31/03926* (2013.01); *H01L 31/046* (2014.12); *H01L 31/0504* (2013.01); *H01L 31/1876* (2013.01); *H01L 51/0097* (2013.01); *H01L 51/441* (2013.01); *H01L 51/445* (2013.01); *H02S 40/32* (2014.12); *H02S 40/38* (2014.12); *Y02E 10/549* (2013.01)

(56) References Cited

U.S. PATENT DOCUMENTS

| | | | |
|---|---|---|---|
| 9,450,126 B1 | 9/2016 | Streett et al. | |
| 2002/0134422 A1* | 9/2002 | Bauman | H01L 31/048 136/244 |
| 2007/0151593 A1 | 7/2007 | Jaynes | |
| 2009/0032087 A1 | 2/2009 | Kalejs | |
| 2010/0024881 A1 | 2/2010 | Hacke et al. | |
| 2010/0051085 A1 | 3/2010 | Weidman et al. | |
| 2010/0283069 A1 | 11/2010 | Rogers et al. | |
| 2012/0186622 A1* | 7/2012 | Dassanayake | H01L 31/048 136/244 |
| 2012/0204938 A1 | 8/2012 | Hacke et al. | |
| 2014/0048900 A1* | 2/2014 | Keysar | H01L 25/167 257/443 |
| 2015/0263182 A1* | 9/2015 | Vornbrock | H01L 31/02013 136/244 |
| 2016/0065653 A1 | 3/2016 | Chen et al. | |

FOREIGN PATENT DOCUMENTS

| | | |
|---|---|---|
| JP | 2011113731 A | 6/2011 |
| JP | 2012522377 A | 9/2012 |
| JP | 2012533905 A | 12/2012 |
| JP | 2015506430 A | 3/2015 |
| JP | 2016096309 A | 5/2016 |
| WO | 2013066884 A1 | 5/2013 |

OTHER PUBLICATIONS

International Search Report and Written Opinion dated May 3, 2017 issued in International Patent Application No. PCT/US2016/065612.

\* cited by examiner

VERSATILE FLEXIBLE CIRCUIT INTERCONNECTION FOR CONNECTING TWO FLEXIBLE SOLAR CELLS

CROSS-REFERENCE TO RELATED APPLICATIONS

This application is a Divisional Application of U.S. Non-Provisional application Ser. No. 15/372,085, entitled "A VERSITILE FLEXIBLE CIRCUIT INTERCONNECTION FOR FLEXIBLE SOLAR CELLS," filed Dec. 7, 2016, which claims priority to U.S. Provisional Application No. 62/264,751 entitled "A VERSATILE FLEXIBLE CIRCUIT INTERCONNECTION FOR FLEXIBLE SOLAR CELLS TO SIMPLIFY INTEGRATION INTO LOW-VOLTAGE ELECTRONIC DEVICE", filed Dec. 8, 2015. The disclosures of the prior application is hereby incorporated in its entirety by reference.

BACKGROUND OF THE DISCLOSURE

Aspects of the present disclosure generally relate to interconnections for flexible solar cells, and more specifically, to flexible interconnections that simplify integration of flexible solar cells with electronic devices.

Photovoltaic cells, which are commonly referred to as solar cells, are solid-state electronic devices that convert light energy to electrical power. Because a solar cell provides clean and convenient power, the demands of integrating a solar module having such solar cells into portable electronics, wearable devices, sensors, electrical appliances and other connected devices is increasing. To power these electrical devices (e.g., end-products) a mechanism of integrating flexible solar cells is needed. Flexible solar cells may refer to, for example, a thin film photovoltaic cell placed on a flexible substrate. The flexible substrate may be made of, for example, polyethylene terephthalate (PET), polyethylene naphthalate (PEN), or polymide (e.g., Dupont™) Kapton®. This mechanism needs to be convenient, reliable, and have a small form factor given the nature of these electrical devices. The integration mechanism also needs to be consistent with techniques used by the electronic device industry and needs to allow for low-cost integration into existing electronic product manufacturing while not limiting the electrical or mechanical properties of the flexible solar cells.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect, a solar module is described that includes one or more solar panels, where each solar panel includes contacts (e.g., a negative contact and a positive contact), and a flexible trace or interconnect having an insulation material and conductive wires. The contacts can be made of a metal or some other contact materials such as transparent conductive oxides (TCOs), for example. The conductive wires may be enclosed in the insulation material and configured to electrically connect the one or more solar panels to a device external to the solar module via termination contacts. The insulation material includes openings with electrically conductive adhesive that provide electrical conductivity between the contacts and the conductive wires.

In another aspect, an electronic device is described that includes a circuit board, one or more solar panels, where each solar panel includes contacts (e.g., a negative contact and a positive contact), and a flexible trace or interconnect having an insulation material and conductive wires. The contacts can be made of a metal or some other contact materials such as transparent conductive oxides (TCOs), for example. The conductive wires may be enclosed in the insulation material and configured to electrically connect the one or more solar panels to the circuit board via termination contacts. The insulation material includes openings with electrically conductive adhesive that provide electrical conductivity between the contacts and the conductive wires.

In yet another aspect, a lighting module is described that includes one or more lighting panels, each lighting panel including metal (e.g., a negative contact and a positive contact), and a flexible trace or interconnect that includes an insulation material and conductive wires. The contacts can be made of a metal or some other contact materials such as transparent conductive oxides (TCOs), for example. The conductive wires may be enclosed in the insulation material and configured to electrically connect the one or more lighting panels to a device external to the lighting module via termination contacts. The insulation material includes openings with electrically conductive adhesive that provide electrical conductivity between the contacts and the conductive wires.

BRIEF DESCRIPTION OF THE DRAWINGS

The appended drawings illustrate only some implementation and are therefore not to be considered limiting of scope.

DETAILED DESCRIPTION

Figure 1:
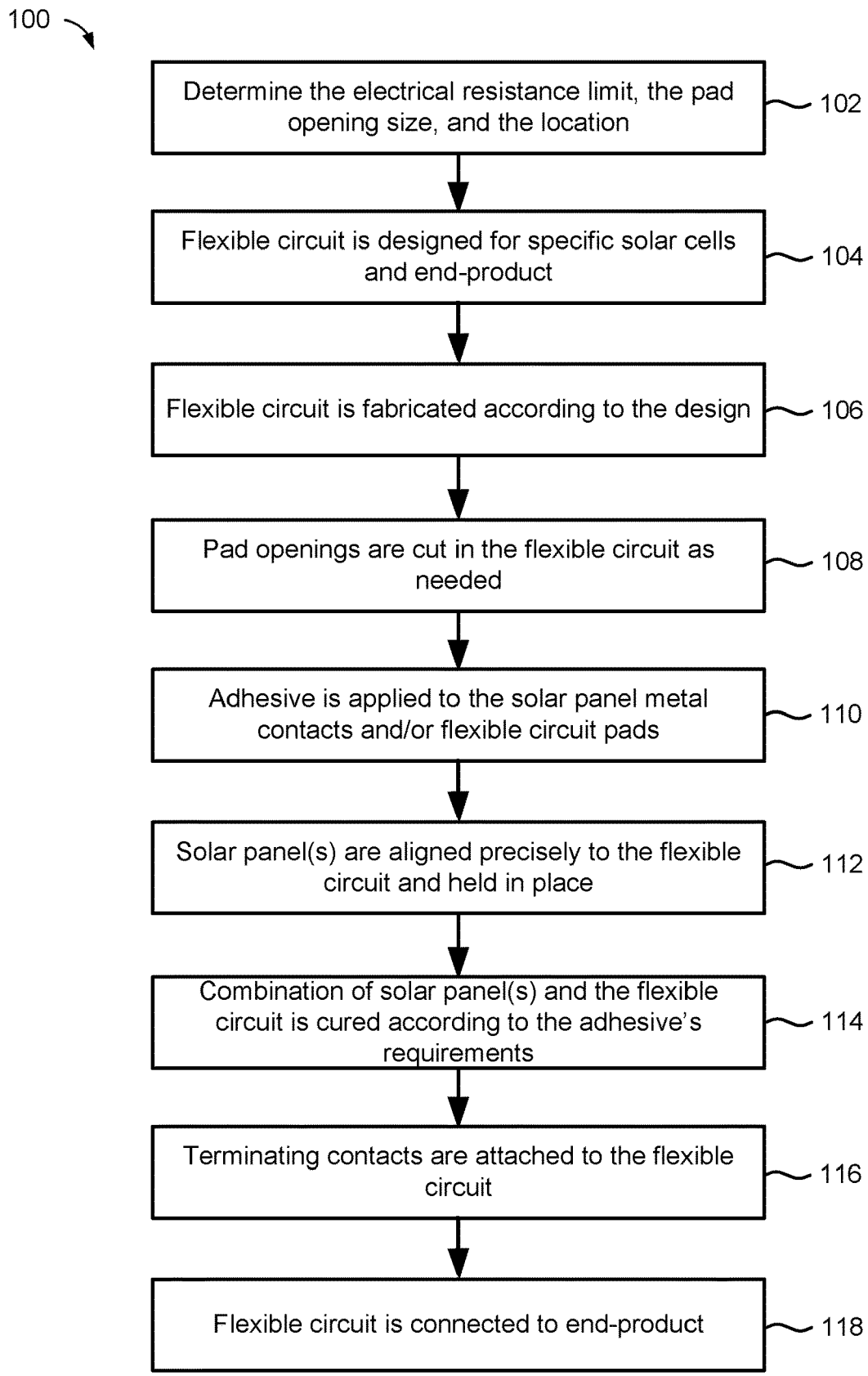
FIG. 1 is a flow diagram that illustrates an example of a general process flow in accordance with aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

This disclosure provides a mechanism for connecting solar cells into matrices (e.g., geometrical arrangements of at least one solar cell) by using flexible circuits. In this disclosure, the terms flexible circuit, flexible trace, and flexible interconnect may be used interchangeably to refer to a flexible mechanism described herein for electrically connecting and mechanically integrating flexible solar cells with electronic devices. Moreover, in this disclosure, a solar panel may refer to a single solar cell or to multiple solar cells connected together and configured to operate as a single solar cell. However, it is understood that the terms solar panel and solar cell may also be used interchangeably depending on context.

In an implementation, the flexible circuit may include one or more layers, where one or more layers may include an insulation material. At least one of the layers in the flexible circuit may include an adhesive, resin, epoxy, acrylic, polyurethane, polyester, polyester-epoxy blend and/or glue layer. The flexible circuit may include a carrier layer having a plastic, wax, rubber, or other polymer such as a polyethylene, polyester, polyolefin, polyethylene terephthalate (PET), polyethylene naphthalate (PEN), and/or polyimide layer, derivatives thereof, or combinations thereof.

Traditional solar cell interconnections use solid flat wires that are simple to assemble and may handle high electrical currents. These solid flat wires, however, tend to be rigid, thick and not easily integrated for use with small electronic devices. For thin-film flexible solar cells, traditional metal ribbons may be a significant fraction of the overall product height and weight. Thus, the use of traditional metal ribbons tends to limit the end-product bend (e.g., curvature) radius to a value that is greater than the intrinsic solar cell bend radius. That is, the flexibility of the solar cell cannot be fully realized because of the limitations of the interconnect. The solution proposed in this disclosure offers a range of benefits and advantages over traditional solar cell wiring, for which additional details are provided below.

While the proposed solution is generally useful for small solar panel/cell assemblies (e.g., less than 50 W of maximum power with currently available flexible circuit technology) suitable for low-power direct current (DC) electronics such as portable electronics, sensors and wearable electronics, with appropriate configuration the proposed solution is extendible to many fields where a flexible form factor is important including integrating flexible solar cells into automobiles, aircraft and building structures.

In addition, while the present disclosure proposes a solution applicable to solar cells in electronic end-products, a same or similar approach may be used for electronic end-products or devices that are used as sources of light. For example, a flexible interconnect may be used for connecting and integrating one or more lighting panels (e.g., one or more thin-film-based light emitting diodes (LEDs) panels or sections) to an electronic device. In an aspect, when multiple lighting panels are used, a first subset of the lighting panels may generate light characterized by a first wavelength (e.g., a first light color) and a second subset of the lighting panels may generate light characterized by a second wavelength (e.g., a second light color).

In another aspect of the present disclosure, an electronic device may have one or more solar panels connected via a first flexible interconnect and one or more lighting panels connected via a second flexible interconnect, where both the first flexible interconnect and the second flexible interconnect are based on the description presented herein.

As described above, the present disclosure provides benefits and advantages over existing solutions. For example, the flexible circuits, traces, or interconnects described herein allow the end-product to maintain the intrinsic flexibility of the assembly, package, or module including panels of flexible thin-film solar cell(s). This allows the final solar cell package to be reliability integrated into a wider range of end-products.

In another aspect of the present disclosure, the positive electrode (p-electrode) and negative electrode (n-electrode) leads of the flexible circuit may be placed at arbitrary locations based on the end-product requirements independent of the locations of the electrodes or contacts (e.g., metal or TCO contacts) on the solar panels. Thus, in those cases where there are several interconnected solar panels, traditional ribbon routing may be skipped.

In yet another aspect of the present disclosure, the pads for n-electrodes and p-electrodes may be placed nearby to each other even when separate on the solar panel. The termination electrodes may be any standard semiconductor connector that may be integrated into a flexible circuit. An example of such a semiconductor connector is a male zero insertion force (ZIF) connector. It is to be understood that other types of semiconductor connectors may also be used.

The flexible circuit, trace, or interconnect technology described in this disclosure may be used for other electronic components such as active matrix displays, touchpads, keyboards that allow for easier integration into a wide range of end-product electronic devices. Moreover, this technology simplifies integration and reduces cost by eliminating the need for insulation when the flexible circuit pad layout and the solar panel metal contacts are properly aligned.

In yet another aspect of the present disclosure, solar panels/cells with different properties including their shape, electronic structure, type of flexible substrate, material composition as well as the location of the electrical contacts may be used interchangeably within a given end-product given the correct flexible circuit design. Moreover, multiple solar panels/cells may be interconnected in series and/or parallel using the same flexible circuit that provides the electrical contacts for integration.

As discussed above, the present solution provides for a solar module for flexible solar interconnection. The solar module includes one or more solar panels (e.g., one or more solar cells), where each solar panel includes contacts (e.g., a negative contact and a positive contact). The contacts can be made of a metal or some other contact materials such as transparent conductive oxides (TCOs), for example. Therefore, in this disclosure, a reference to a metal contact may be interpreted to also be a reference to any type of conductive contact such as conductive oxides, including TCOs. The solar module also includes a flexible circuit, trace, or interconnect having an insulation material and conductive wires. The conductive wires may be enclosed in the insulation material and configured to electrically connect the one or more solar panels to a device external to the solar module (e.g., an end-product device) via termination contacts. The insulation material includes openings with conductive adhesive that provide electrical conductivity between the metal contacts and the conductive wires.

The present solution also provides for an electronic device that uses flexible solar interconnection. The electronic device includes a circuit board and one or more solar panels (e.g., one or more solar cells), where each solar panel includes metal contacts (e.g., a negative metal contact and a positive metal contact). The electronic device also includes a flexible circuit, trace, or interconnect having an insulation material and conductive wires. The conductive wires may be enclosed in the insulation material and configured to electrically connect the one or more solar panels to the circuit board via termination contacts. The insulation material includes openings with conductive adhesive that provide electrical conductivity between the metal contacts and the conductive wires. The circuit board may include circuitry for processing the output of the solar panels. For example, the circuit board may include circuitry for converting the output of the solar panels into a DC voltage/current for charging a storage device (e.g., a battery) or for operating other aspects of the electronic device.

The present solution also provides for a lighting module for flexible light source interconnection. The lighting module may include one or more lighting panels (e.g., one or more LED panels), where each lighting panel includes metal contacts. The lighting module may also include a flexible circuit, trace, or interconnect having an insulation material and conductive wires enclosed in the insulation material and configured to electrically connect the one or more lighting panels to a device external to the lighting module via termination contacts. The insulation material may include openings with conductive adhesive that provide electrical conductivity between the metal contacts and the conductive wires.

The proposed solar module, electronic device, and lighting module are different from existing solutions in that the conductive wires are enclosed in an insulation material and not in a cell encapsulation layer. Moreover, the flexible circuit, trace, or interconnection in the solar module and the electronic device are fabricated separate and before assembly. Instead, existing solutions place interconnects on a solar module during the assembly process.

The proposed solar module, electronic device, and lighting module are different from existing solutions that claim to employ flexible interconnects for inter-cell connection or for cell-external circuitry connection. These types of flexible interconnects, however, are similar to conventional copper (Cu) ribbon and other solid flat wires, which limit the flexibility of using thin-film flexible solar cells.

The various implementations and embodiments of the proposed solar module and electronic device include one or more of flexible thin-film photovoltaic panel(s), a flexible circuit, conductive adhesive, and termination contacts. Additional details of each are provided below. Implementations and embodiment of the proposed lighting module may use similar elements with flexible light sources being used instead of flexible solar panels.

For the solution proposed in the present disclosure, one or more flexible thin-film photovoltaic panels (e.g., solar panel(s)) may be used. As described above, a single solar panel may include one or more photovoltaic cells (e.g., solar cells); however, the terms solar panels and solar cells may be used interchangeably in some contexts. The negative contact (n-contact) and the positive contact (p-contact) for each solar panel may be on the front or back of the solar panel. The position of the n-contact and the p-contact on a solar panel need not affect the end-product. Instead, the shape and construction of the flexible circuit may be more of a consideration regarding the overall curvature that can be provided for the end-product.

The front side of the solar panel may be the side that is illuminated for the solar panel to produce electrical power. In the case of bi-facial solar panels (e.g., two sides are used to produce electrical power), the front side of the solar panel may be considered to be the one that generates the most power when directly illuminated at a normal incidence.

For the solution proposed in the present disclosure, a flexible circuit, also referred to as a flexible trace, a flexible trace interconnect, a flexible interconnect, or simply as a flex circuit, may be implemented that suits a particular end-product and the specific types (e.g., shape, size, spectral characteristics) of solar panels used. The flexible circuit may include an insulation material within which conductive wires (e.g., electrical traces) may be disposed.

The flexible circuit is configured to connect to the necessary solar panel(s) for the end-product and provide standardized connection pads for integration into the end-product. If solar panels are interconnected in series then multiple electrical traces may be required within the flexible circuit. For example, for each (N) solar panels connected in series, (N+1) discrete electrical traces may be needed in the flexible circuit.

For the flexible circuit, consideration is to be given in the design and selection of the electrical traces, pads and conductive adhesives to ensure the series resistance limit of the solar panel is not exceeded.

For the flexible circuit, pad openings may be made in the flexible circuit to interconnect to the solar panels and their metal contacts. Moreover, pad openings may be made in the flexible circuit to connect to the end-product or attach one or more standardized connectors.

A conductive adhesive (or simply adhesive) used in connection with the present solution may be a conductive paste, solder paste, ink, solder preform, conductive adhesive preform depending on the specifics of the solar panel material and the resistance requirements for the end-product's operating parameters.

As described above, termination contacts may be used to connect the solar panels in the solar module to the end-product or the solar panels in an electronic device to a circuit board of the electronic device, the electronic device being the end-product in such a case. The termination contacts may be part of the flexible circuit (e.g., a male-ZIF connector) or may be attached to the flexible circuit. In some implementations, the termination contacts may include pads for connecting to an external device or a circuit board. For low-voltage applications, the termination contacts may include one n-contact and one p-contact independent of the number of solar panels in the overall solution.

FIG. 1 is a flow diagram 100 that illustrates an example of a general process flow in accordance with aspects of this disclosure. Aspects of the flow diagram 100 may be taken together or separate. For example, some aspects of the flow diagram 100 may involve the implementation of certain configuration or design considerations and other aspect of the flow diagram 100 may involve the implementation of assembly and fabrication considerations. The solutions offered by the configuration considerations, the assembly and fabrication considerations, or both, are different from other existing solutions to similar situations at least for the reasons provided herein.

At block 102, a determination is made of the electrical resistance limit of the solar panels in a solar module or electronic device, a pad opening size, and a location of one or more pad openings in a flexible circuit. This determination is taken into consideration for the configuration of the electrical and physical attributes (e.g., length, number of solar panels) of a flexible circuit, trace, or interconnect as well as the operating conditions (e.g., temperature, incident light spectrum (wavelengths), incident light intensity) of the end product.

At block 104, a flexible circuit may be configured, at least based on the determination in block 102, for a specific type of solar panels and a particular end-product. The type associated with a solar panel may be based on the material of the solar panel (e.g., III-V semiconductor materials), a size of the solar panel, a shape of the solar panel, or a combination. The configuration of the flexible circuit may include the location of one or more tabs extending from an elongated portion of the flexible circuit, where the one or more tabs include the pad openings for connecting the metal contacts of the solar panels to conductive wires in the flexible circuit.

At block 106, a flexible circuit may be implemented (e.g., manufactured, fabricated, assembled) according to the configuration or design adopted in block 104.

At block 108, pad openings are cut or made in the flexible circuit (e.g., cut on an insulation material of the flexible circuit) as needed based on the configuration of the flexible circuit.

At block 110, a conductive adhesive may be applied to the solar panel contacts (e.g., metal contacts) and/or to the flexible circuit pads.

At block 112, the solar panel(s) to be connected are aligned to the flexible circuit and held in place. In some implementations, when multiple solar panels are to be included in the solar module or electronic device, and when the multiple solar panels are positioned to either side of an elongated portion of the flexible circuit, the solar panels on one side may be aligned with the solar panels on the other side or the solar panels on one side may be misaligned (e.g., staggered) relative to the solar panels of the other side.

At block 114, the combination of the solar panel(s) and the flexible circuit may be cured according to the conductive adhesive's requirement to provide a suitable electrical and mechanical connection between the solar panel(s) and the flexible circuit.

At block 116, termination contacts may be attached to the flexible circuit. In some implementations, the termination contacts may be in the form of a connector such as a ZIF connector. In other implementations, the termination contacts may be in the form of electrical pads.

At block 118, the flexible circuit may be provided for connection to an end-product. For example, in a solar module, the flexible circuit may be provided for connection to an external electronic device. In another example, for an electronic device, the flexible circuit may be provided for connection to a circuit board of the electronic device.

Figure 2:
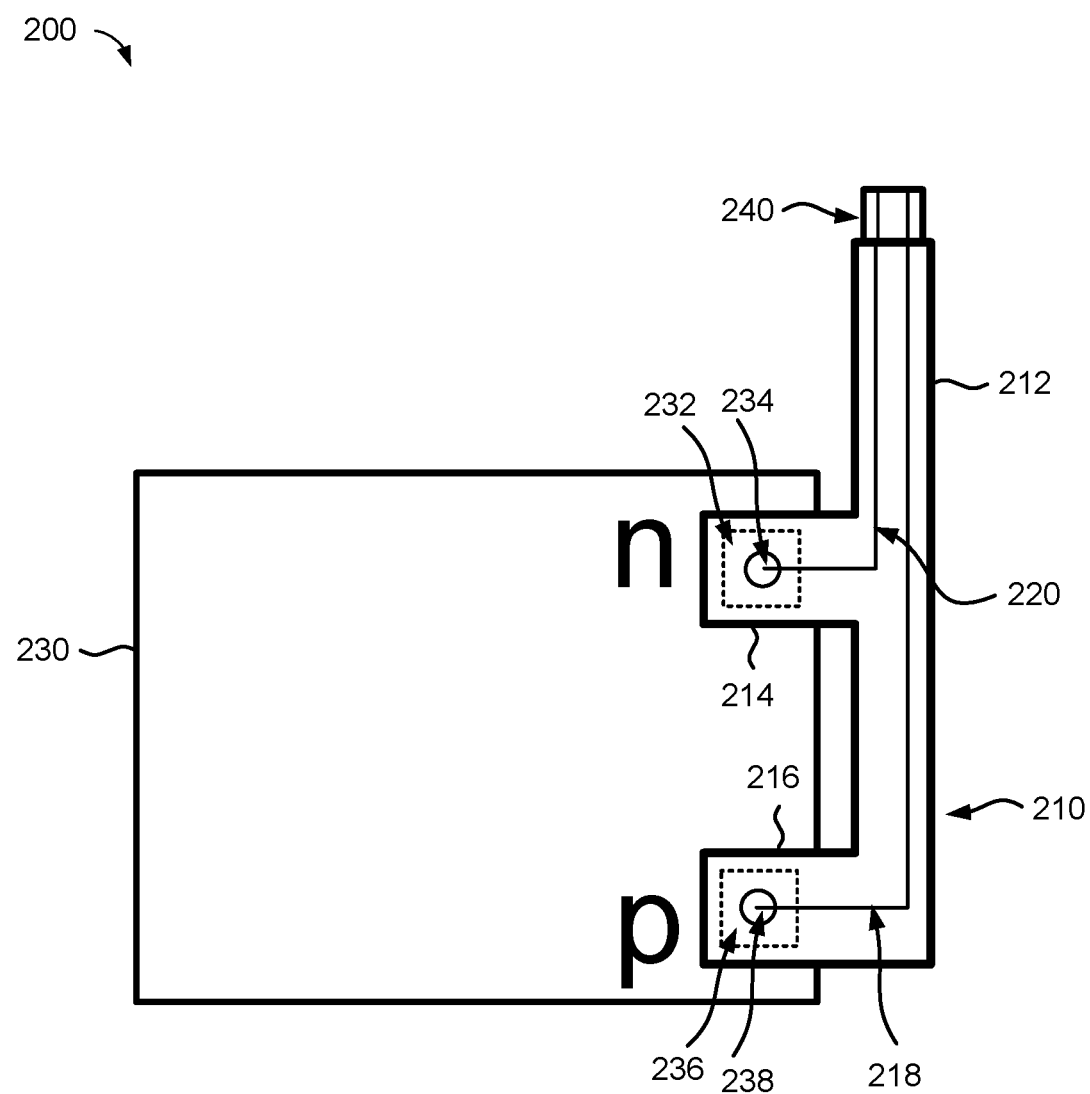
FIG. 2 is a diagram that illustrates an example of a solar module having a single solar panel flexible trace in accordance with aspects of this disclosure.

FIG. 2 is a diagram that illustrates an example of a solar module 200 having a single solar panel flexible trace in accordance with aspects of this disclosure. The solar module 200 includes a flexible circuit or flexible trace 210 having an elongated portion 212 and two tabs 214, 216 extending from one side of the elongated portion 212 (e.g., from one side along the length of the elongated portion 212). The solar module 200 also includes a solar panel 230. The solar panel 230 may also be referred to as a solar cell 230. The solar panel 230 may include a single solar cell or may include multiple solar cells connected together to effectively operate as a single solar cell.

The solar panel 230 includes a negative contact (n-contact) identified by the letter "n" and aligned/collocated with a pad opening 232 in the flexible circuit 210. The solar panel 230 also includes a positive contact (p-contact) identified by the letter "p" and aligned/collocated with a pad opening 236 in the flexible circuit 210.

The n-contact is electrically connected to electrical trace 220 in the flexible circuit 210 via a conductive adhesive placed between a pad 234 connected to the electrical trace 220 and the n-contact. The electrical trace 220 may be a conductive wire disposed within an insulation material of the flexible circuit 210. The conductive adhesive may also provide structural or mechanical connection between the area of the solar panel 230 around the n-contact and the tab 214.

The p-contact is electrically connected to electrical trace 218 in the flexible circuit 210 via a conductive adhesive placed between a pad 238 connected to the electrical trace 218 and the p-contact. The electrical trace 218 may be a conductive wire disposed within an insulation material of the flexible circuit 210. The conductive adhesive may also provide structural or mechanical connection between the area of the solar panel 230 around the p-contact and the tab 216.

The solar module 200 may also include a termination contact 240. The termination contact 240 may be electrically connected to the electrical traces 218, 220 in the flexible circuit 210. In some implementations, the termination contact 240 may be a male ZIF connector.

In one implementation, the solar module 200 may be characterized as having a single solar panel or cell (e.g., solar panel 230), having contact positions on the front of the solar panel, and a male ZIF connector. Front contact may refer to having As shown in FIG. 2, this implementation uses a single solar panel and a single flexible circuit with two (2) electrical traces (218, 220). The flexible circuit 210 is configured such that the electrical traces do not cross or overlap. As described above, the flexible circuit 210 includes pad openings 232 and 236 that are made or cut on the back of the flexible circuit 210 and that are aligned or collocated with the front metal contacts of the solar panel 230. The termination contact 240 of the flexible circuit 210 provides a negative termination contact and a positive termination contact that are next to each other to meet the specification of, for example, a 2-contact male ZIF connector.

Figure 3:
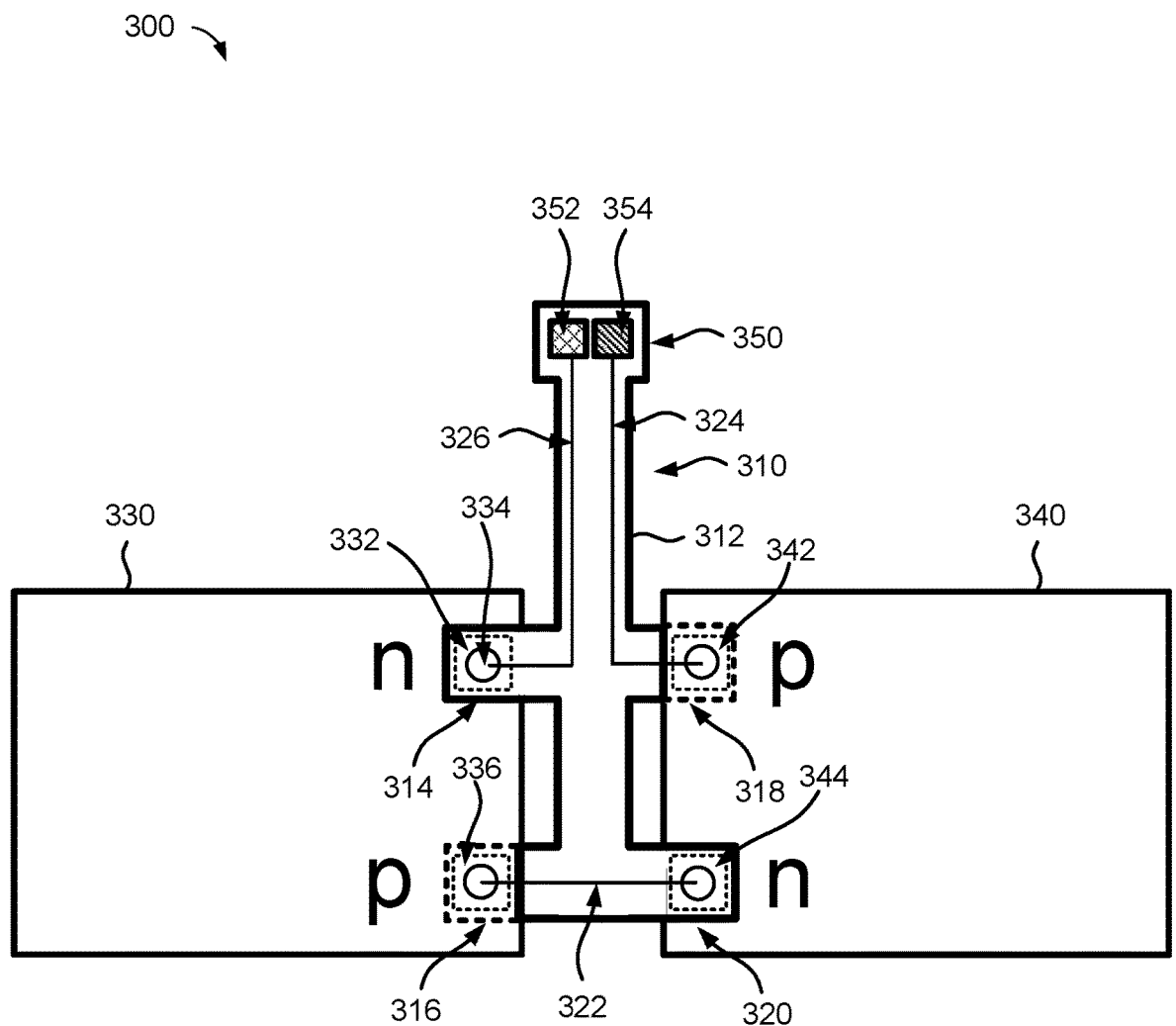
FIG. 3 is a diagram that illustrates another example of a solar module having a flexible trace with solar panels connected in series in accordance with aspects of this disclosure.

FIG. 3 is a diagram that illustrates an example of a solar module 300 having a flexible trace with solar panels connected in series in accordance with aspects of this disclosure. The solar module 300 includes a flexible circuit or flexible trace 310 having an elongated portion 312 and two tabs 314, 316 extending from a first side of the elongated portion 312 (e.g., from a first side along the length of the elongated portion 312), and another two tabs 318, 320 extending from a second side of the elongated portion 312 (e.g., from a second side along the length of the elongated portion 212).

The solar module 300 also includes a solar panel 330 positioned to the first side of the elongated portion 312 and a solar panel 340 positioned to the second side of the elongated portion 312. The solar panels 330, 340 may also be referred to as solar cells 330, 340. Each of the solar panels 330, 340 may include a single solar cell or may include multiple solar cells connected together to effectively operate as a single solar cell.

The solar panel 330 includes a negative contact (n-contact) identified by the letter "n" and aligned/collocated with a pad opening 332 in the flexible circuit 310. The solar panel 330 also includes a positive contact (p-contact) identified by the letter "p" and aligned/collocated with a pad opening 336 in the flexible circuit 310.

The n-contact is electrically connected to electrical trace 326 in the flexible circuit 310 via a conductive adhesive placed between a pad 334 connected to the electrical trace 326 and the n-contact. The electrical trace 326 may be a conductive wire disposed within an insulation material of the flexible circuit 310. The conductive adhesive may also provide structural or mechanical connection between the area of the solar panel 330 around the n-contact and the tab 314.

The p-contact is electrically connected to electrical trace 322 in the flexible circuit 310 via a conductive adhesive. The electrical trace 322 may be a conductive wire disposed within an insulation material of the flexible circuit 310. The conductive adhesive may also provide structural or mechanical connection between the area of the solar panel 330 around the p-contact and the tab 316.

The solar panel 340 includes a negative contact (n-contact) identified by the letter "n" and aligned/collocated with a pad opening 344 in the flexible circuit 310. The solar panel 340 also includes a positive contact (p-contact) identified by the letter "p" and aligned/collocated with a pad opening 342 in the flexible circuit 310.

The n-contact is electrically connected to electrical trace 322 in the flexible circuit 310 via a conductive adhesive. As described above, the electrical trace 322 is also connected to the p-contact of the solar panel 330. The conductive adhesive may also provide structural or mechanical connection between the area of the solar panel 340 around the n-contact and the tab 320.

The p-contact is electrically connected to electrical trace 324 in the flexible circuit 310 via a conductive adhesive. The electrical trace 324 may be a conductive wire disposed within an insulation material of the flexible circuit 310. The conductive adhesive may also provide structural or mechanical connection between the area of the solar panel 340 around the p-contact and the tab 318.

The solar module 300 may also include a termination contact 350. The termination contact 350 may be electrically connected to the electrical traces 324, 326 in the flexible circuit 310. In some implementations, the termination contact 350 may include two termination pads 352, 354, which are respectively connected to the electrical traces 326, 324. In an example, the termination pads 352, 354 may be solder pads.

In one implementation, the solar module 300 may be characterized as having multiple, series-connected solar panels or cells (e.g., solar panels 330, 340), front n-contact and rear p-contact configuration for connecting to the solar panels, and solder pads for connectors. Front contact may refer to contact being made to the front side of the solar panel and back contact may refer to contact being made to the back side of the solar panel. For front contact to a solar panel the pad opening is cut or made on the back of the flexible circuit, and for back contact to a solar panel the pad opening is cut or made on the front of the flexible circuit.

As shown in FIG. 3, this implementation uses multiple solar panels for connection to a single end-product. The flexible circuit 310 may include as many layers as necessary to interconnect all the solar panels with the end-product. A single layer flexible circuit 310 may be used when there is no need for the electrical traces (e.g., electrical traces 322, 324, and 326) within the flexible circuit 310 to cross each other. As shown in FIG. 3, the flexible circuit 310 has pad openings on the back for the n-contacts (e.g., pad openings 332 and 344), and on the front for the p-contacts (e.g., pad openings 336 and 342). In this regard, also as shown in FIG. 3, the tabs 314 and 320 are positioned over the solar panels, while the tabs 316 and 318 are positioned (or folded) under the solar panels. The flexible circuit 310 may also include pad openings that are aligned or collocated with the solder pads 352, 354 to provide negative and positive termination contacts for the end-product.

Figure 4:
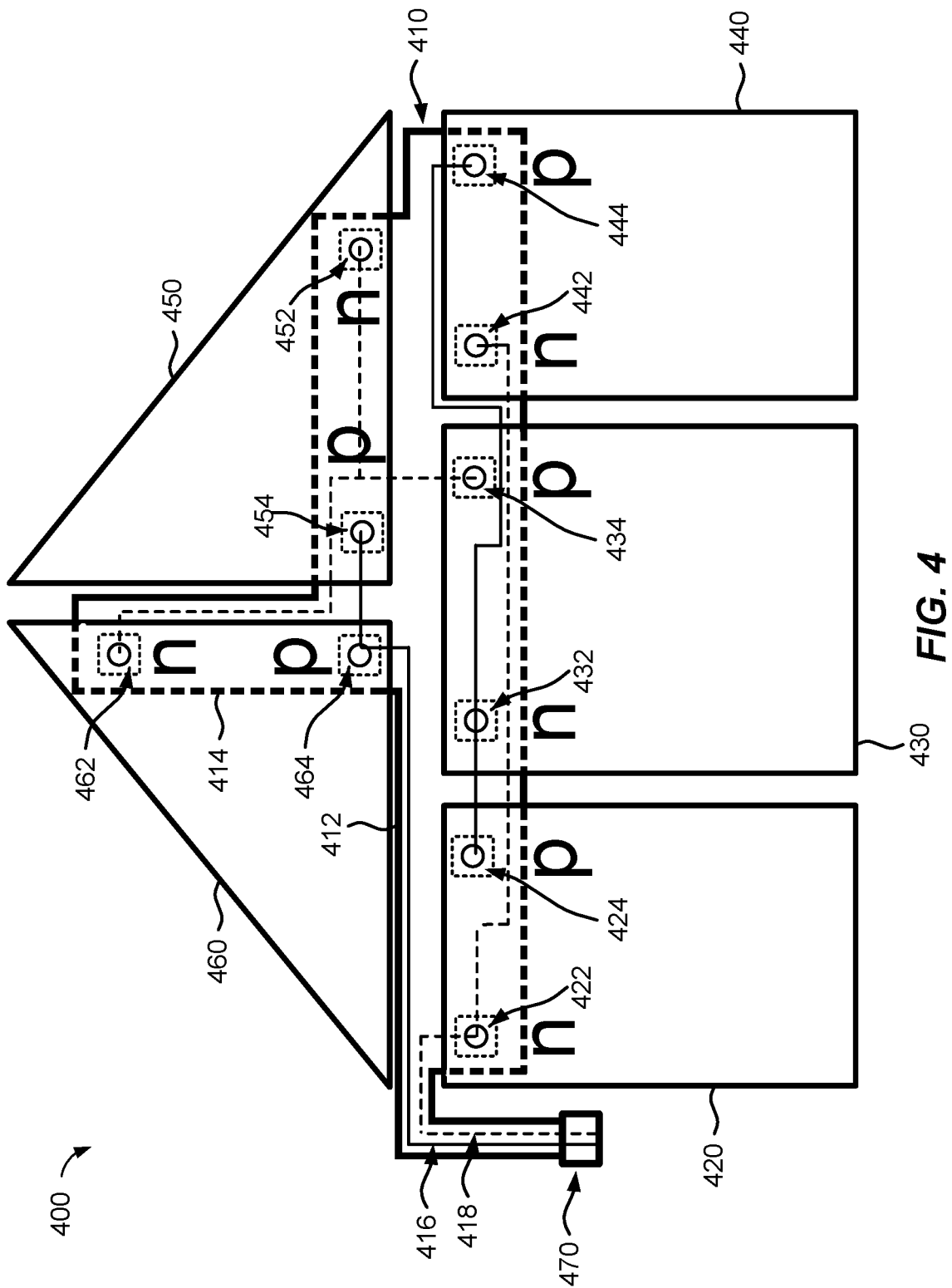
FIG. 4 is a diagram that illustrates another example of a solar module having a flexible trace with multiple solar panels in accordance with aspects of this disclosure.

FIG. 4 is a diagram that illustrates an example of a solar module 400 having a flexible trace with multiple solar panels in accordance with aspects of this disclosure. The solar module 400 includes a flexible circuit or flexible trace 410 having a first elongated portion 412 and a second elongated portion 414 extending from a side of the first elongated portion 412. The first elongated portion 412 has a varying width along its length to accommodate connections to multiple solar panels. The wider portion of the first elongated portion 412 corresponds to the portion having a larger number of connections between the flexible circuit 410 and the solar panels.

The solar module 400 includes multiple solar panels 420, 430, 440, 450, and 460. As shown in FIG. 4, the solar panels may have different sizes and/or shapes. The solar panels may also be referred to as solar cells. Each of the solar panels may include a single solar cell or may include multiple solar cells connected together to effectively operate as a single solar cell.

Each of the solar panels in FIG. 4 includes a negative contact (n-contact) identified by the letter "n" and a positive contact (p-contact) identified by the letter "p". For the solar panel 420, the n-contact is aligned/collocated with a pad opening 422 in the flexible circuit 410 and the p-contact is aligned/collocated with a pad opening 424. For the solar panel 430, the n-contact is aligned/collocated with a pad opening 432 in the flexible circuit 410 and the p-contact is aligned/collocated with a pad opening 434. For the solar panel 440, the n-contact is aligned/collocated with a pad opening 442 in the flexible circuit 410 and the p-contact is aligned/collocated with a pad opening 444. For the solar panel 450, the n-contact is aligned/collocated with a pad opening 452 in the flexible circuit 410 and the p-contact is aligned/collocated with a pad opening 454. For the solar panel 460, the n-contact is aligned/collocated with a pad opening 462 in the flexible circuit 410 and the p-contact is aligned/collocated with a pad opening 464.

The various solar panels in the solar module 400 are connected by several electrical traces as shown in FIG. 4. These electrical traces are connected in such a way that the output of the solar module 400 is two (2) electrical traces 416, 418 that connect to a termination contact 470. The termination contact 470 may be a ZIF connector, for example.

In one implementation, the solar module 400 may be characterized as having solar panels or cells (e.g., solar panels 420, 430, 440, 450, and 460) of different sizes and/or shapes connected in series and parallel, rear n-contact and rear p-contact configuration for connecting to the solar panels, and a male ZIF connector. As shown in FIG. 4, this implementation is a non-limiting example for connecting solar panels of different sizes and/or shapes to an electronic end-product. An aspect of this implementation is that the solar panels connected in series may be configured to have the same operating current. For example, if a first solar panel (A, 450) and a second solar panel (B, 460) are connected in parallel and these two solar panels are then connected to a third solar panel (C, 430) in series, then the electrical current through the third solar panel ($I_C$) is the sum of the electrical currents through the first and second solar panels ($I_A$, $I_B$).

In this implementation, the flexible circuit 410 may include as many layers as necessary to interconnect all the solar panels with an end-product. A single layer flexible circuit 410 may be used when there is no need for the electrical traces within the flexible circuit 410 to cross each other. As shown in FIG. 4, the flexible circuit 410 has pad openings on the front for the n-contacts (e.g., pad openings 422, 432, 442, 452, and 462), and on the front for the p-contacts (e.g., pad openings 424, 434, 444, 454, and 464). The termination contact 240 of the flexible circuit 210 provides a negative termination contact and a positive termination contact that are next to each other to meet the specification of, for example, a 2-contact male ZIF connector. Moreover, multiple flexible circuits 410 may be used if required for a specific end-product.

Figure 5:
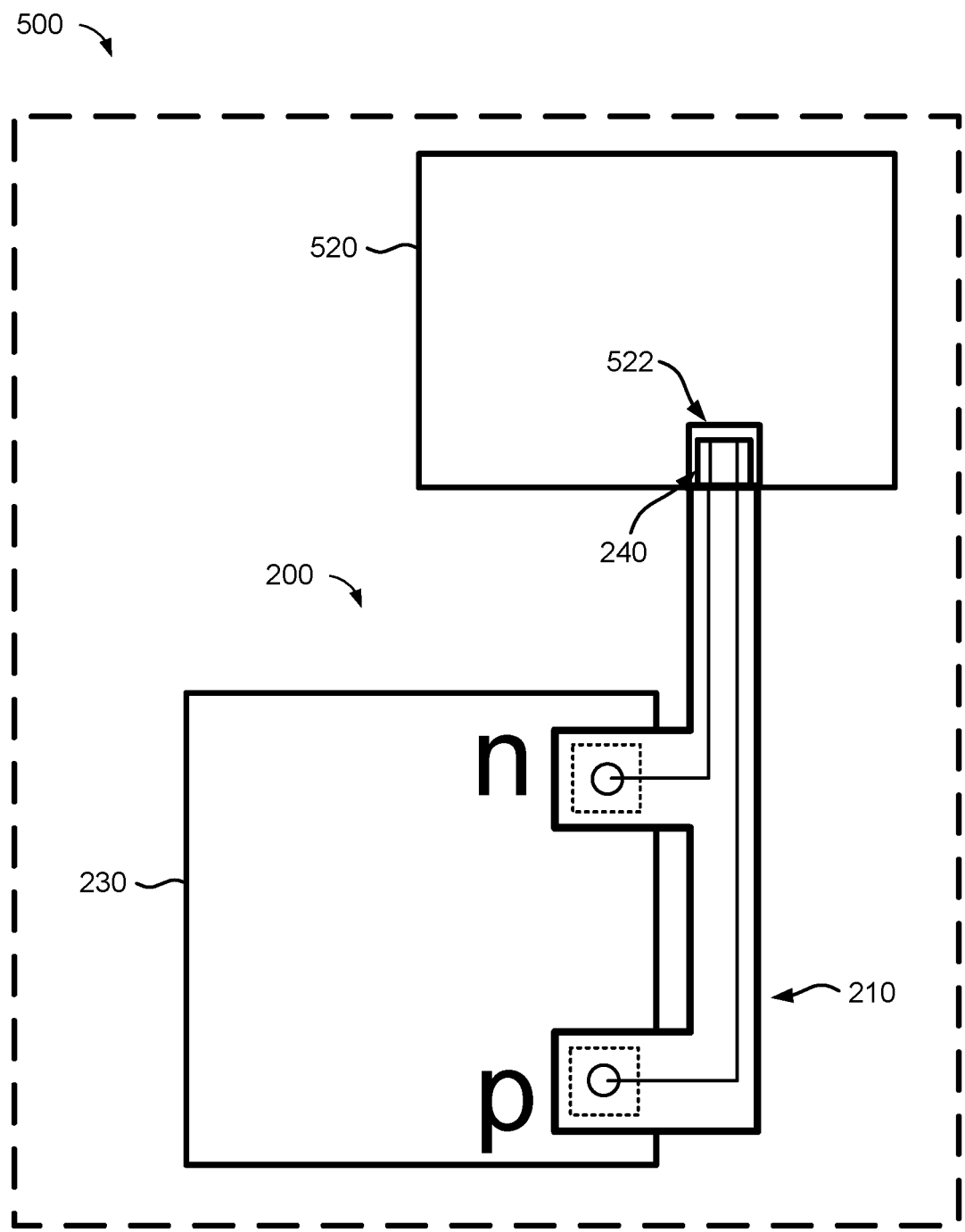
FIG. 5 is a diagram that illustrates an example of an electronic device having a solar module in accordance with aspects of this disclosure.

FIG. 5 is a diagram that illustrates an example of an electronic device 500 having a solar module in accordance with aspects of this disclosure. In this example, the electronic device 500 may be, for example, a portable electronic device, a sensor, a wearable electronic device, or the like. In one example, the electronic device 500 may be an internet-of-things (IoT) device or part of an IoT device. In another example, the electronic device 500 may be an unmanned aerial vehicle (UAV) or part of an UAV.

The electronic device 500 may include a solar module. For purposes of illustration, the solar module in this example may be the solar module 200 of FIG. 2. Other solar modules, however, may also be used such as the solar modules 300 and 400 in FIGS. 3 and 4, respectively.

The electronic device 500 may also include a circuit board 520 with a connector 522 configured to enable an electrical and mechanical connection between the solar module 200, and more specifically the flexible circuit 210 of the solar module 200, and the circuit board 520. The connector 522 may be configured to complement the termination contact 240. For example, if the termination contact 240 is a male ZIF connector, the connector 552 may be a female ZIF connector. The circuit board 520 may include one or more electronic components (not shown), including at least one electronic component configured to convert the output of the solar module 200 into a DC voltage/current for charging a storage device (e.g., a battery) or for operating other aspects of the electronic device 500. The circuit board 520 may optionally include at least one processor and at least one memory or data storage device.

While the examples described in connection with FIGS. 2-5 relate to solar modules and electronic devices including solar modules, similar components, techniques, or implementations may be applied to light-emitting (lighting) modules and electronic devices including lighting modules. For example, in FIG. 2 the solar panel 230 may be a lighting panel (e.g., a light-emitting panel) configured to produce or generate one or more wavelengths of light when connected to an end-product. Similarly, the solar panels in FIGS. 3-5 may be lighting panels instead. In these implementations, the electrical resistance of the conductive wires, the pad opening size, the location of the pad openings, or a combination thereof, may be taken into consideration to configure the appropriate flexible circuit, trace, or interconnect for a particular end-product.

Although the present disclosure has been provided in accordance with the implementations shown, one of ordinary skill in the art will readily recognize that there could be variations to the embodiments and those variations would be within the scope of the present disclosure. For example, the metal contacts on either the front side and/or the back side of a device may be replaced by a highly conductive yet transparent or semi-transparent layer, for example a transparent conductive oxide and that would be within the scope of the present disclosure. Accordingly, many modifications may be made by one of ordinary skill in the art without departing from the scope of the appended claims.

What is claimed is:

1. A solar module, comprising:
a first solar panel including first contacts;
a second solar panel including second contacts; and
a flexible trace including:
an insulation material that forms multiple tabs; and
conductive wires enclosed in the insulation material and configured to electrically connect the first solar panel and the second solar panel to a device external to the solar module via termination contacts positioned at one end of the flexible trace, wherein the insulation material includes openings with electrically conductive adhesive that provide electrical conductivity between the first contacts of the first solar panel and the conductive wires and between the second contacts of the second solar panel and the conductive wires, the multiple tabs of the insulation material being positioned such that the openings of a first portion of the multiple tabs overlap the first contacts of the first solar panel and the openings of a second portion of the multiple tabs overlap the second contacts of the second solar panel, wherein the first portion of the multiple tabs and the second portion of the multiple tabs include different tabs.

2. The solar module of claim 1, wherein the flexible trace is configured to provide electrical and mechanical connectivity between the first solar panel and the device and the second solar panel and the device.

3. The solar module of claim 1, wherein each solar panel includes one or more solar cells.

4. The solar module of claim 1, wherein:
the first contacts of the first solar panel include a positive contact and a negative contact, and
the second contacts of the second solar panel also include a positive contact and a negative contact.

5. The solar module of claim 1, wherein the first solar panel and the second solar panel are of a same size and shape.

6. The solar module of claim 1, wherein the termination contacts include a zero insertion force (ZIF) connector electrically connected to the conductive wires, the ZIF connector configured to provide electrical and mechanical connectivity between the solar module and the device.

7. The solar module of claim 1, wherein the flexible trace includes an elongated, flexible portion from which the multiple tabs extend.

8. The solar module of claim 1, wherein the conductive wires in the flexible trace are configured to connect the first solar panel and the second solar panel in a series configuration.

9. The solar module of claim 1, wherein the conductive wires in the flexible trace are configured to connect the first solar panel and the second solar panel in a parallel configuration.

10. The solar module of claim 1, wherein each of the first solar panel and the second solar panel is fabricated with thin film flexible solar cells.

11. The solar module of claim 1, wherein each of the first solar panel and the second solar panel is fabricated with thin-film flexible solar cells made of III-V semiconductor materials.

12. The solar module of claim 1, wherein:
the first contacts include a first positive contact and a first negative contact,
the second contacts include a second positive contact and a second negative contact, and
the multiple tabs include a first tab, a second tab, a third tab, and a fourth tab, wherein the first tab overlaps the first negative contact on a front portion of the first solar panel and the second tab overlaps the first positive contact on a back portion of the first solar panel, and wherein the third tab overlaps the second negative contact on a front portion of the second solar panel and the fourth tab overlaps the second positive contact on a back portion of the second solar panel.

13. An electronic device, comprising:
a circuit board;
a first solar panel including first contacts;
a second solar panel including second contacts; and
a flexible trace including:
   an insulation material that forms multiple tabs; and
   conductive wires enclosed in the insulation material and configured to electrically connect the first solar panel and the second solar panel to the circuit board via termination contacts positioned at one end of the flexible trace, wherein the insulation material includes openings with electrically conductive adhesive that provide electrical conductivity between the first contacts of the first solar panel and the conductive wires and between the second contacts of the second solar panel and the conductive wires, the multiple tabs of the insulation material being positioned such that the openings of a first portion of the multiple tabs overlap the first contacts of the first solar panel and the openings of a second portion of the multiple tabs overlap the second contacts of the second solar panel, wherein the first portion of the multiple tabs and the second portion of the multiple tabs include different tabs.

14. The electronic device of claim 13, wherein the flexible trace is configured to provide electrical and mechanical connectivity between the first solar panel and the circuit board and the second solar panel and the circuit board.

15. The electronic device of claim 13, wherein each of the first solar panel and the second solar panel includes one or more solar cells.

16. The electronic device of claim 13, wherein the termination contacts include a zero insertion force (ZIF) connector electrically connected to the conductive wires, the ZIF connector configured to provide electrical and mechanical connectivity between the electronic device and the circuit board.

17. The electronic device of claim 13, wherein the flexible trace includes an elongated, flexible portion from which the multiple tabs extend.

18. The electronic device of claim 13, wherein each of the first solar panel and the second solar panels is fabricated with thin film flexible solar cells made of III-V semiconductor materials.

19. The electronic device of claim 13, wherein the electronic device is:
an internet-of-things (IoT) device, or
an unmanned aerial vehicle (UAV).

20. A lighting module, comprising:
a first lighting panel including first contacts;
a second lighting panel including second contacts; and
a flexible trace including:
   an insulation material that forms multiple tabs; and
   conductive wires enclosed in the insulation material and configured to electrically connect the first lighting panel and the second lighting panel to a device external to the lighting module via termination contacts of the lighting module positioned at one end of the flexible trace, wherein the insulation material includes openings with electrically conductive adhesive that provide electrical conductivity between the first contacts of the first lighting panel and the conductive wires and between the second contacts of the second lighting panel and the conductive wires, the multiple tabs of the insulation material being positioned such that the openings of some of the tabs overlap the first contacts of the first lighting panel and the openings of the remaining tabs overlap the second contacts of the second lighting panel.

* * * * *